United States Patent [19]
Webb

[11] Patent Number: 5,353,146
[45] Date of Patent: Oct. 4, 1994

[54] OPTICAL SIGNAL REGENERATOR AND OPTICAL COMMUNICATIONS SYSTEM INCORPORATING SAME

[75] Inventor: Roderick P. Webb, Woodbridge, England

[73] Assignee: British Telecommunications public limited company, London, England

[21] Appl. No.: 949,253

[22] PCT Filed: May 8, 1991

[86] PCT No.: PCT/GB91/00732
§ 371 Date: Nov. 23, 1992
§ 102(e) Date: Nov. 23, 1992

[87] PCT Pub. No.: WO91/17474
PCT Pub. Date: Nov. 14, 1991

[30] Foreign Application Priority Data
May 8, 1990 [GB] United Kingdom ............... 9010242

[51] Int. Cl.[5] .......................................... H04B 10/16
[52] U.S. Cl. ........................... 359/158; 359/173; 359/336; 359/179
[58] Field of Search ............. 359/336, 346, 345, 333, 359/179, 173, 158

[56] References Cited
U.S. PATENT DOCUMENTS
4,941,738  7/1990  Olsson .................. 359/333

FOREIGN PATENT DOCUMENTS
0247834  12/1987  European Pat. Off. .
0251486   1/1988  European Pat. Off. .
0096929   4/1991  Japan .................. 359/333
WO86/07657 12/1986  PCT Int'l Appl. .

*Primary Examiner*—Leslie Pascal
*Attorney, Agent, or Firm*—Nixon & Vanderhye

[57] ABSTRACT

An optical signal regenerator has a semiconductor laser in a resonant cavity defined by a mirror and a semireflective facet of the laser to form a resonant, non-linear, optical amplifier. A polarization beam splitter allows resonance in one polarization mode only. A clock signal generator provides clock signals in the resonant polarization mode of a power just below the optical power bistable threshold of the amplifier. An information signal coupled to the laser by a lens and the beam splitter is in a non-resonant mode of the amplifier and will give rise to a regenerator output by triggering the bistability. Because the information signal is in a non-resonant mode its wavelength need not be controlled to lie near a resonance peak of the amplifier so reducing control requirements.

13 Claims, 2 Drawing Sheets

OPTICAL SIGNAL REGENERATOR AND OPTICAL COMMUNICATIONS SYSTEM INCORPORATING SAME

BACKGROUND OF THE INVENTION

1. Field of the Invention

Communications and data transmission systems which transmit information signals in the form of optical pulses over a dielectric waveguide such as an optical fibre are now commonplace. Whilst improvements in the sources of the optical pulses and in the optical fibre waveguides have increased the range over which such signals can be transmitted to between 100 and 200 kilometers it is still necessary to regenerate the signals when they are transmitted over greater distances and when their power is reduced by beam splitting, being switched or otherwise handled.

In this specification, the term optical is intended to refer to the visible region of the electromagnetic spectrum together with those parts of the infrared and ultraviolet regions at each end of the visible region which are capable of being transmitted by dielectric optical waveguides such as optical fibres.

2. Related Art

The applicant's patent U.S. Pat. No. 4,879,761 granted on Nov. 7, 1989 describes a regenerator in which the regeneration takes place in the optical domain. This obviates the need for optical to electrical conversion by a photodiode which electrical signal is then amplified and reshaped in an electronic regenerator circuit before being converted by an optical source into an optical pulse once again for onward transmission along the next optical fibre transmission line.

The above optical regenerator comprises a resonant laser amplifier biased to a level just below the lasing threshold of the laser amplifier. Clock signals are coupled to the amplifier having a power just below the optical bistable threshold of the amplifier so that when an optical information signal is also coupled to the amplifier during the application of a clock signal, the bistable threshold of the amplifier is exceeded causing a sudden jump in the power of the optical output of the amplifier to provide a regenerated optical information signal.

It should be noted that the lasing threshold and the bistable threshold apply to distinct phenomena. The electrical bias applied to the laser amplifier is below the lasing threshold bias current and consequently the amplifier does not lase. The sudden amplification occurs because the optical power of an input optical signal is made to exceed an optical power bistable threshold for the amplifier.

When the optical power input to a semiconductor laser amplifier is increased, the extra stimulated emission raises the recombination rate and the carrier density is correspondingly reduced. As a result, the effective refractive index of the active region of a resonant laser amplifier increases with the optical power passing through it. The amplifier resonances are thereby tuned to longer wavelengths, and the gain at a given wavelength there fore varies. The power transfer characteristics of such an amplifier are consequently non-linear and, at appropriate input wavelengths, bistable operation is made possible.

Regeneration using the above described regenerator is achieved by combining an information signal that is to be regenerated with an optical clock signal and coupling them both into the resonant, non-linear optical amplifier.

The clock signal consists of a train of optical pulses at the desired regeneration rate and with a wavelength at which the amplifier is bistable. The peak power of the clock signal is held marginally below the bistable threshold optical power level at which the amplifier will jump into a higher gain state.

With a low power information signal the output of the amplifier is in a lower gain state and its output comprises the slightly amplified clock signal. When the information signal increases to a high enough level such that the power in the combined information and clock signals is sufficient to exceed the bistable threshold, the resonant wavelength of the laser amplifier is suddenly matched to that of the light passing through it and the amplifier jumps into the higher gain state. It remains in this state, even if the input signal level again falls, until the end of the current clock signal. The output of the amplifier for that period then includes a highly amplified clock signal.

The complete regenerated signal comprises a train of return-to-zero pulses with the timing and wavelength of the clock signal.

In this prior art regenerator of U.S. Pat. No. 4,879,761 the information signal need not be at the same wavelength as the clock signal as long as it is shifted from the output wavelength by a multiple of the amplifier mode spacing to ensure that the amplifier has adequate gain at the information signal wavelength to trigger the bistable operation.

The wavelength of the clock signals and their power must be closely controlled to lie close to the bistable threshold. This wavelength is dependent on the amplifier resonant mode and control can be maintained relatively easily due to the colocation of the source of the optical clock signal, and the regenerator. The wavelength of the information signal is not so critical—some variation is possible while still obtaining sufficient gain from the resonant amplifier to trigger the bistability—but the control is more difficult due to the remoteness of the source of the information signals from the regenerator.

SUMMARY OF THE INVENTION

According to a first aspect of the present invention an optical signal regenerator comprises:
- a resonant, non-linear, optical amplifier including gain material for providing optical gain and capable of exhibiting bistability at a first wavelength;
- a clock signal generator for generating optical clock signals at the first wavelength and at an optical power just below the optical power bistable threshold of the amplifier at the first wavelength; and
- a first and a second optical coupling means for coupling the optical clock signals and an information signal to the amplifier in a resonant mode and a non-resonant mode of the amplifier, respectively.

Because the information signal is in a non-resonant mode of the amplifier, that is a mode which can be called orthogonal to the clock signal mode, the information signal will show no resonances and so can provide the extra stimulated emission in the gain material to exceed the bistable threshold of the amplifier and so shift the amplifier into the higher gain state even if the information signal wavelength doesn't correspond to a resonance peak of the resonator. That is, the sensitivity of the regenerator to the information signal is broadband so reducing the control requirement on the wavelength of the information signal.

The amplifier may comprise a semiconductor laser within a Fabry-Perot resonator cavity.

The orthogonal clock signal and information signal modes may be any convenient modes. For example the resonant amplifier may include a polarisation separating device, for example a polarising beamsplitter, so that the amplifier resonates in one polarisation only. The optical clock signals are coupled to the amplifier having a polarisation that allows resonance, the information signals coupled in the orthogonal polarisation at which the amplifier is not resonant. The polarising beamsplitter can act as the second optical coupling means.

The orthogonal modes may be frequency modes if a wavelength dependant beamsplitter is included in the amplifier. Orthogonal spatial modes may also be employed, for example, by using a twin-stripe semiconductor laser having end facets, the first and second optical coupling means being arranged so that the clock signals and information signals overlap in the gain material but are spatially separated at the end facets, the end facets being selectively anti-reflection coated to reflect only the clock signals.

According to a further aspect of the present invention an optical communication system comprises an optical signal regenerator according to the first aspect of the present invention disposed between an input optical transmission fibre and an output optical transmission fibre.

BRIEF DESCRIPTION OF THE DRAWINGS

Embodiments of the invention will now be described by way of example only with reference to the accompanying drawings of which.

DETAILED DESCRIPTION OF EXEMPLARY EMBODIMENTS

Figure 1:
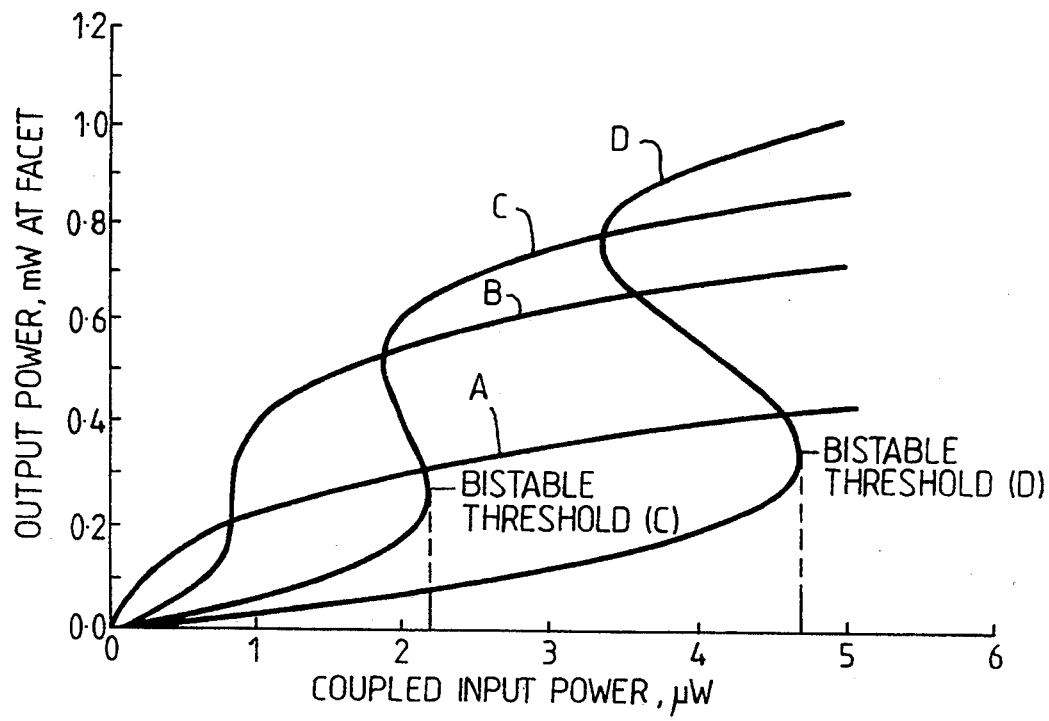
FIG. 1 is a graph illustrating the output power input power characteristics of an amplifier for light of different wavelengths.

FIG. 1 shows typical theoretical characteristics of an amplifier, as will be described with reference to FIG. 3, for light input of four different wavelengths A, B, C, D at increasing wavelengths, respectively, than a resonant wavelength for the amplifier at zero input power. For light having a wavelength which is different from the resonant wavelength of the amplifier at zero input power the characteristic curve is generally S-shaped. In this case, where the input wavelength exceeds the zero power resonance by 0.1 nm or less, as shown by curves A and B, the characteristic is not bistable. The S-shaped curves C and D illustrate the bistable nature of the laser amplifier when the input wavelength is slightly longer.

Under these conditions, as the input power increases the output power gradually increases until it approaches the first knee of the curve which defines the bistable threshold of the laser amplifier for the jump to the higher amplification level for that input wavelength. As soon as the input power reaches this bistable threshold there is sudden jump as the output power increases to that shown by the upper part of the curve.

Figure 2:
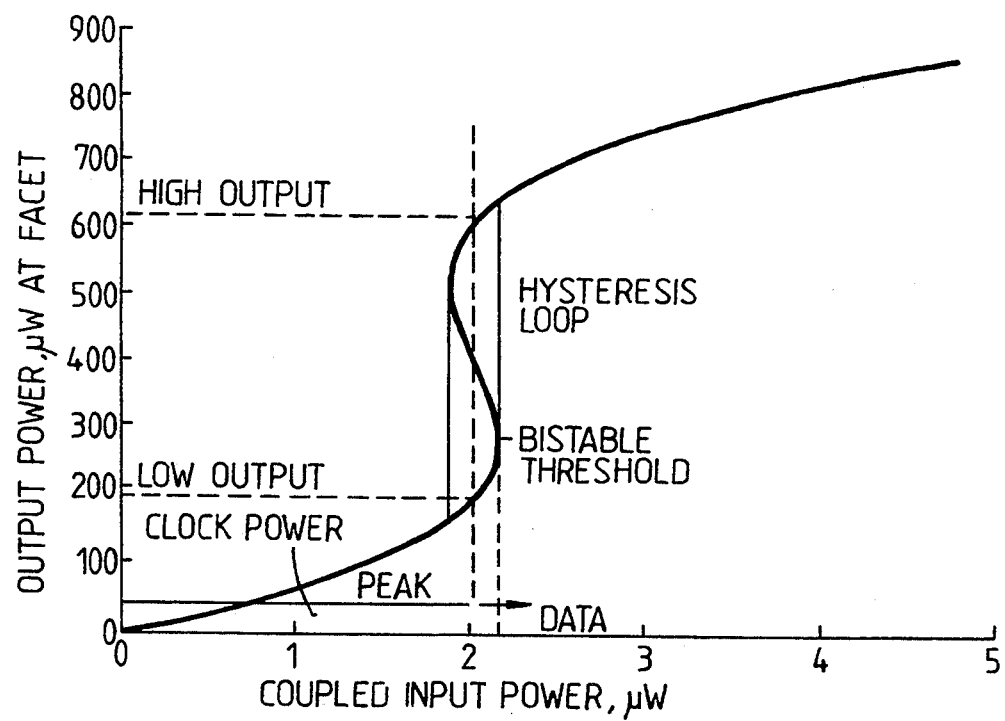
FIG. 2 is a graph of output power against input power illustrating the typical operation range of the laser amplifier of FIG. 1.

FIG. 2 shows one such curve from which it is clear that if the power of the clock signals passing through the laser amplifier is arranged to be close to the bistable threshold then a slight increase in the optical power, for example that provided by the optical information in an input optical signal, is just sufficient to exceed the bistable threshold. This results in an immediate jump in output power of the amplifier to the upper part of the curve shown in FIG. 2. During any subsequent reduction of the optical input information signal the output power returns along the upper part of the curve. The regenerated output signal therefore remains high for the remainder of the duration of the clock pulse irrespective of a subsequent fall in the optical information signal. Thus, with both the clock signal and an information signal being applied to the laser amplifier for example, the output of the amplifier follows the hysteresis loop shown in FIG. 2 moving between the high and low amplification levels to provide a regenerated signal which consists of large and small pulses at the clock frequency corresponding to "ones" and "zeroes" in the input signal. The low level amplification of the clock signal during the input signal lows therefore means that the extinction ratio is finite.

Figure 3:
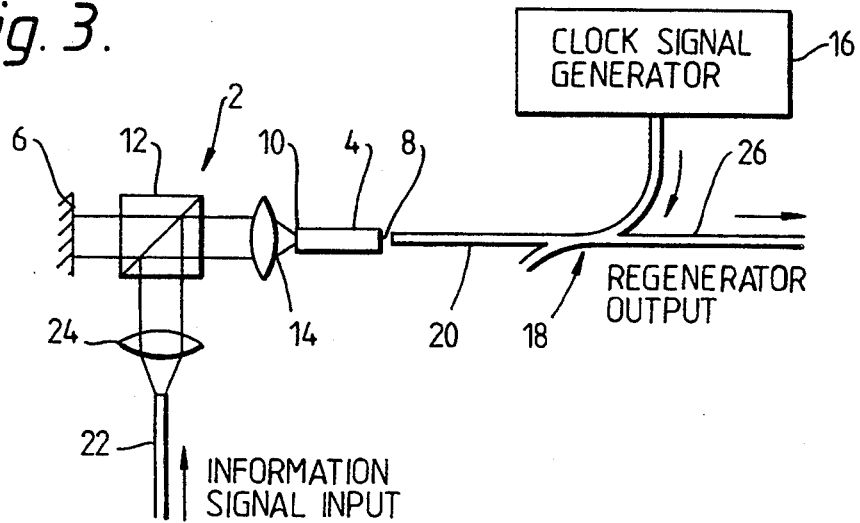
FIGS. 3 and 4 are schematic diagrams of embodiments of optical regenerators according to the present invention in an optical communications system incorporating the same using orthogonal polarisation modes.

Referring now to FIG. 3, an optical signal regenerator in accordance with the present invention incorporated in an optical communications system includes a resonant, non-linear laser amplifier comprising a double channel planar buried heterostructure semiconductor laser 4 such as that described in an article in Electronics Letters May 23, 1985, Vol. 21, No. 11, pages 493–494, entitled "High Performance DC-PBH Lasers at 1.52 micrometers by a Hybrid MOVPE/LPE Process", by Nelson A. W., Wong S., Regnault J. C., Hobbs R. E., Murrel D. L., and Walling R. H. The laser 4 is located within a resonant cavity defined by a fully reflecting mirror 6 and a partially reflecting facet 8 of the laser 4 and constitutes the gain material of the resonant amplifier 2. The facet 10 of the laser 4 nearer the mirror 6 is anti-reflection coated.

A polarising beam splitter 12 located between the laser 4 and the mirror 6 permits resonance in one polarisation mode, only, the light exiting the laser 4 at the facet 10 being collimated by a lens 14.

An optical clock signal generator 16 comprises an external cavity laser driven by a Mb/second pattern generator (not shown). The clock signals are coupled to the resonant amplifier 2 by means of an optical coupler 18 and an optical fibre 20, the pulses being end-fired at the facet 8 of the laser 4. The clock signals are set to the polarisation which is able to resonate in the resonant amplifier and at an optical power just below its bistable threshold.

An information signal to be regenerated is coupled to the gain material 4 of the amplifier 2 via an input optical fibre 22, a collimating lens 24 and the polarising beam splitter 12. Only that component of the information signal which is in the polarisation mode orthogonal to the resonant polarisation mode will reach the gain material 4. The orthogonal polarization will show no resonance and its bandwidth will be determined by that of the gain material 4. (about 50 nm for the semiconductor laser 4).

Information signal sensitivity will be polarisation dependent, but polarisation control, scrambling or diversity could be used.

In the absence of an information signal and with the clock signal generator providing a string of clock pulses, the clock signal are slightly amplified by the resonant amplifier 2 with a resultant low level output at the clock signal wavelength by the coupler 18 to the output optical fibre 26. The introduction of an information signal to the resonant amplifier of sufficient power to reach the bistable threshold of the resonant amplifier causes the clock signals to be amplified to the higher level and to pass out of the fibre 26 as the regenerated output by triggering the bistability in the manner described earlier.

Figure 4:
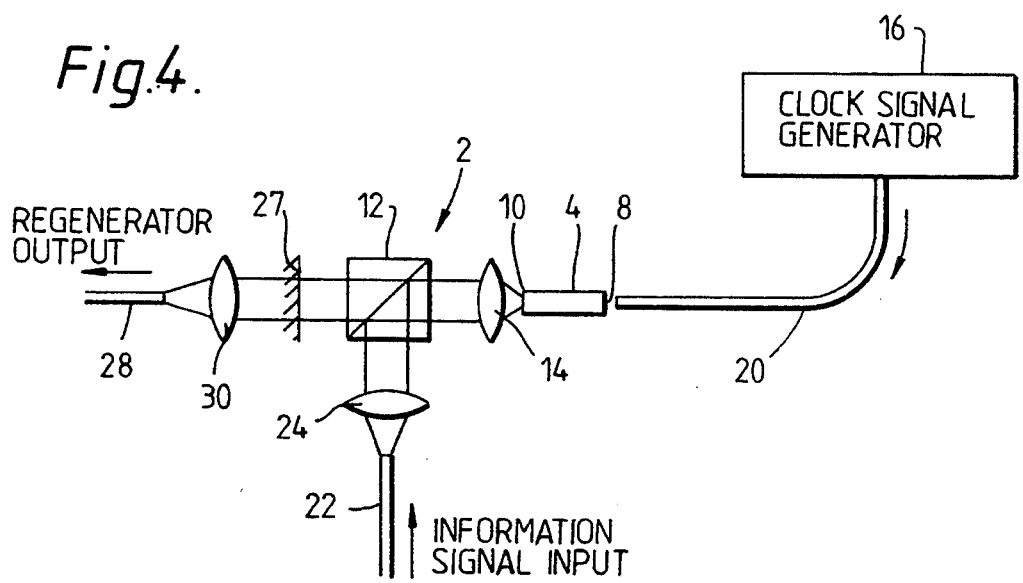

Referring to FIG. 4, a second embodiment of the present invention is shown similar to that shown in FIG. 1, with like components denoted by the same reference numerals, in which the fully reflecting mirror 6 of FIG. 1 has been replaced by a partially reflecting mirror 27 so that the regenerated output may be obtained through it, the output being focussed on an optical fibre 28 by a lens 30. In this embodiment the clock signal generator is directly coupled to the fibre 20.

Figure 5:
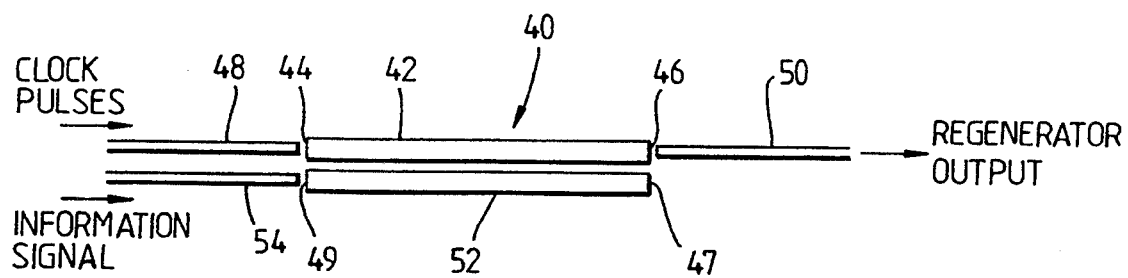
FIG. 5 is a schematic diagram of a further embodiment of an optical regenerator incorporated in a communication system using orthogonal spatial modes, according to the present invention using orthogonal spatial modes.

Embodiments of the present invention may employ other orthogonal modes. The embodiment of FIG. 5 employs orthogonal spatial modes. A twin-stripe laser 40 has a first stripe laser 42 having a partially reflective mirrored end facets 44 and 46 to form a resonant amplifier.

By control of the bias to the stripes or segments of the stripes, the two spatial modes are caused to overlap in some central region of the device 40 but to be separated at the facets 44, 46, 47 and 49. Thus they share a non-linear gain medium but only the clock pulses encounter the mirrored facets 44 and 46.

Clock signals are coupled to the stripe laser 42 via an optical fibre 48 with the output from the laser 42 being end-fired from the facet 46 to the optical fibre 50. The bias of the laser 42 and the optical power and wavelength of the clock pulses are such that the laser 42 is just below a bistable threshold.

A second stripe laser 52 of the twin-stripe laser 40 has facets 47 and 49 having sufficiently low reflectivities to prevent lasing on the introduction of an information signal to the laser 52 via an optical fibre 54.

The information signal does not resonate, in contrast to the clock pulses, due to the spatial separation of the respective inputs at the facets 44, 46, 47 and 49. That is, the clock pulses and information signals are in spatially orthogonal modes, the former, only, being a resonant mode of the amplifier 40.

The optical coupling between the stripe lasers is controllable which permits the control and information signals to overlap in the gain material but be spatially separated at the facets 44, 46, 47 and 49.

The presence of an information signal will deplete the carriers in the laser stripes 42 and 52 causing the regenerator output to jump from the low level to the high level in the manner previously described in respect of the FIG. 1 embodiment when a clock signal is present.

The above described embodiments are implemented with discrete optical components, with some being bulk optical components in the FIGS. 1 and 2 embodiments. The invention is equally applicable to optical generators using micro-optics, fibre components or totally integrated regenerators, integrated in InGaAsP or other semiconductor appropriate for the wavelength to be regenerated.

I claim:

1. An optical signal regenerator comprising:
   a resonant, non-linear, optical amplifier including gain material for providing optical gain, and capable of exhibiting bistability at a first wavelength with a power threshold between a first relatively low power output state and a second relatively high power output state;
   a clock signal generator for generating optical clock pulses at the first wavelength and at an optical power just below the optical power bistability threshold of the amplifier at the first wavelength;
   first coupling means for coupling the optical clock pulses to the resonant amplifier in a resonant mode thereof;
   a source of information pulses; and
   second coupling means for coupling the information pulses to the amplifier in a non-resonant mode thereof;
   whereby bistable switching to one of said power states occurs upon an initial concurrent occurrence of an information pulse and a clock pulse, with subsequent bistable switching to the other of the power states occurring when the clock pulse is terminated.

2. A regenerator as in claim 1 in which the amplifier comprises a semiconductor laser within a Fabry-Perot resonator cavity.

3. A regenerator as in claim 1 in which the clock signals and the information signal have different frequencies.

4. A regenerator as in claim 1 in which the first optical coupling means comprises an optical fibre.

5. An optical communications system comprising an optical signal regenerator as in claim 1 disposed between an input optical transmission fibre and an output optical transmission fibre.

6. A method of transmitting an information signal including the step of regenerating the information signal by use of a regenerator as in claim 1.

7. A method of regenerating an optical information signal, comprising:
   configuring a resonant, non-linear, optical amplifier including gain material for providing optical gain, to exhibit bistability with a power threshold between a first relatively low power output state and a second relatively high power output state;
   generating optical clock pulses at an optical power just below the optical power bistability threshold of the amplifier;
   coupling the optical clock pulses to the resonant amplifier in a resonant mode thereof; and
   coupling information pulses to the amplifier in a non-resonant mode thereof;
   whereby bistable switching to one of said power states occurs upon an initial concurrent occurrence of an information pulse and a clock pulse, with subsequent bistable switching to the other of the power states occurring when the clock pulse is terminated.

8. An optical signal regenerator comprising:
   a resonant, non-linear, optical amplifier including gain material for providing optical gain, and capable of exhibiting bistability at a first wavelength;

a clock signal generator for generating optical clock signals at the first wavelength and at an optical power just below the optical power bistable threshold of the amplifier at the first wavelength; and a first and a second optical coupling means for coupling the optical clock signals and an information signal to the amplifier in a resonant mode and a non-resonant mode of the amplifier, respectively;

in which the clock signals and the information signal have different frequencies; and in which the second optical coupling means comprises a frequency dependent polarising beam splitter located within the resonator cavity so that the amplifier cannot resonate at the frequency of the information wavelength.

9. An optical signal regenerator comprising:

a resonant, non-linear, optical amplifier including gain material for providing optical gain, and capable of exhibiting bistability at a first wavelength;

a clock signal generator for generating optical clock signals at the first wavelength and at an optical power just below the optical power bistable threshold of the amplifier at the first wavelength; and a first and a second optical coupling means for coupling the optical clock signals and an information signal to the amplifier in a resonant mode and a non-resonant mode of the amplifier, respectively;

in which the clock signals and the information signals are in orthogonal spatial modes.

10. A regenerator as in claim 9 in which:

the amplifier comprises a twin-stripe semiconductor laser having end facets, the first and second optical coupling means are arranged so that the clock signals and information signals overlap in the gain material but are spatially separated at the end facets, and the end facets are selectively anti-reflection coated to reflect only the clock signals.

11. An optical signal regenerator comprising:

a resonant, non-linear, optical amplifier including gain material for providing optical gain, and capable of exhibiting bistability at a first wavelength;

a clock signal generator for generating optical clock signals at the first wavelength and at an optical power just below the optical power bistable threshold of the amplifier at the first wavelength; and a first and a second optical coupling means for coupling the optical clock signals and an information signal to the amplifier in a resonant mode and a non-resonant mode of the amplifier, respectively;

in which the clock signals and the information signal are in orthogonal polarisation modes.

12. A regenerator as in claim 11 in which the second optical coupling means comprises a polarising beam splitter located within a resonator cavity so that the amplifier resonates in one polarisation mode only.

13. A regenerator as in claim 12 in which the second optical coupling means further comprises a lens for collimating an information signal end-fired from an optical waveguide.

* * * * *